United States Patent
Chan et al.

(10) Patent No.: US 8,216,636 B2
(45) Date of Patent: Jul. 10, 2012

(54) METHOD OF ALIGNING NANOTUBES

(75) Inventors: Bee Eng Mary Chan, Singapore (SG); Qing Zhang, Singapore (SG); Yehai Yan, Qingdao (CN); Sai Li, Singapore (SG); Longqing Chen, Singapore (SG)

(73) Assignee: Nanyang Technological University, Singapore (SG)

( * ) Notice: Subject to any disclaimer, the term of this patent is extended or adjusted under 35 U.S.C. 154(b) by 471 days.

(21) Appl. No.: 12/373,050

(22) PCT Filed: Jul. 27, 2007

(86) PCT No.: PCT/SG2007/000223
§ 371 (c)(1),
(2), (4) Date: Jan. 8, 2009

(87) PCT Pub. No.: WO2008/013508
PCT Pub. Date: Jan. 31, 2008

(65) Prior Publication Data
US 2009/0246408 A1  Oct. 1, 2009

Related U.S. Application Data

(60) Provisional application No. 60/833,792, filed on Jul. 28, 2006.

(51) Int. Cl.
*B05D 5/12* (2006.01)

(52) U.S. Cl. ....... 427/122; 427/97.1; 427/98.4; 427/117

(58) Field of Classification Search ................. 427/97.7, 427/98.4, 117, 122; 977/890, 932
See application file for complete search history.

(56) References Cited

U.S. PATENT DOCUMENTS

| | | | |
|---|---|---|---|
| 6,741,017 B1 * | 5/2004 | Ide et al. | 313/310 |
| 6,872,645 B2 * | 3/2005 | Duan et al. | 438/584 |
| 6,887,450 B2 * | 5/2005 | Chen et al. | 423/445 R |
| 6,896,864 B2 * | 5/2005 | Clarke | 423/447.1 |
| 7,122,106 B2 * | 10/2006 | Lin et al. | 205/109 |
| 7,162,308 B2 * | 1/2007 | O'Brien et al. | 607/116 |
| 2006/0138658 A1 * | 6/2006 | Ravi et al. | 257/741 |
| 2007/0178658 A1 * | 8/2007 | Kelley et al. | 438/401 |
| 2008/0020487 A1 * | 1/2008 | McLean et al. | 438/1 |

FOREIGN PATENT DOCUMENTS
WO  WO 03/060208  7/2003

OTHER PUBLICATIONS

Messer, Benjamin et al., Microchannel Networks for Nanowire Patterning, J. Am. Chem Soc. 2000, vol. 122, pp. 10232-10233, American Chemistry Society, 2000.

* cited by examiner

*Primary Examiner* — Brian K Talbot
(74) *Attorney, Agent, or Firm* — SNR Denton US LLP

(57) ABSTRACT

A method of aligning nanotubes is described, where a plurality of channels is provided on a substrate (100), a suspension of nanotubes is placed on or adjacent an open surface of the channels (102) and the suspension is allowed to flow into the channels to align the nanotubes substantially parallel to the longitudinal axis of the channels (104).

26 Claims, 5 Drawing Sheets

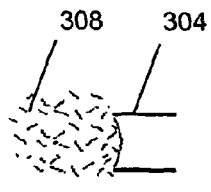
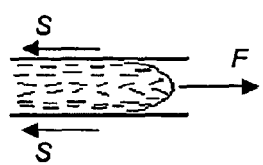
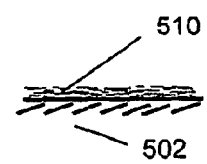
FIGURE 3  FIGURE 4  FIGURE 5
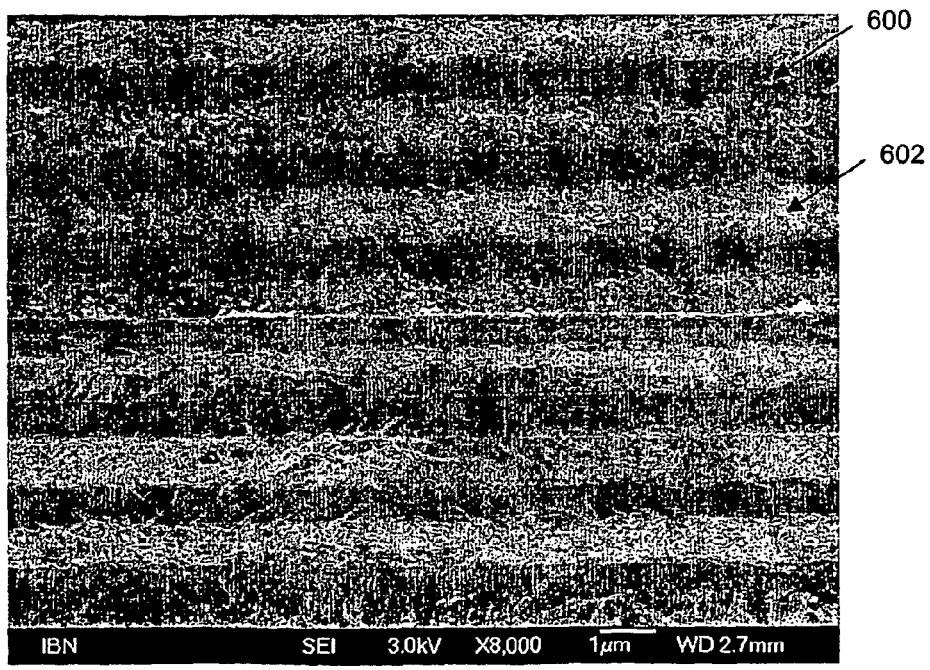
FIGURE 6A

METHOD OF ALIGNING NANOTUBES

CROSS-REFERENCE TO OTHER APPLICATIONS

This is a National Phase of International Application No. PCT/SG2007/000223 filed on Jul. 27, 2007, which claims priority from U.S. Provisional Patent Application No. 60/833,792, filed on Jul. 28, 2006.

FIELD OF THE INVENTION

The present invention relates to a method of aligning nanotubes. In particular, but not exclusively, the present invention relates to a method of aligning nanotubes in one or more microchannels using fluidic alignment.

BACKGROUND TO THE INVENTION

Nanotubes, in particular carbon nanotubes (CNTs), are essentially one-dimensional metallic or semiconducting materials. The electrical properties of nanotubes are dependent on, amongst others, their dimensions and orientation. When properly formed and oriented, nanotubes provide great electrical current handling capability, high thermal conductivity and high mechanical strength. These properties make nanotubes an ideal material for molecular or nano-scale electronic devices. Examples of electronic devices that have been implemented using CNTs include CNT transistors and CNT sensors.

In the past, nanotubes in the devices were formed by spin-coating or other like techniques. The formed nanotubes were randomly distributed, highly entangled and had unpredictable electrical properties. More recently, however, nanotubes have been controllably assembled into hierarchical arrays. Such assembly is typically done using methods that fall in one of two categories: in situ synthesis and post synthesis. In situ synthesis methods typically involve catalyst patterning and chemical vapour deposition (CVD). However, their high processing temperature (typically >800° C.) significantly limits the choice of substrate materials. Furthermore, the as-grown nanotubes usually have many defects and, as such, have varying conductivity.

Post-synthesis methods are typically solution-based methods. One example method that is specific to nanowires is disclosed in an article entitled 'Directed Assembly of One-Dimensional Nanostructures into Functional Networks' by Lieber et al (Science, 291, 630-633 (2001)). In that method, a substrate is first chemically patterned to have amine-functionalized nanopatterns and bare methyl-functionalized areas. The pattern is made using electron beam lithography and immersing the substrate in a solution of 3-Aminopropyltriethoxysilane (APTES). A micropatterned polydimethylsiloxane (PDMS) mold is then provided over the substrate such that a channel is formed between the mold and the substrate. A nanowire suspension is then controllably flowed inside the channel to assemble the nanowires into arrays of individual nanowires. The method of Lieber et al is, however, not suitable for nanotubes because it relies on the nanowires' inherent rigidity, which nanotubes do not have. The unsuitability of the method of Lieber et al for nanotubes has been noted in an article entitled 'Self-Assembled, Deterministic Carbon Nanotube Wiring Networks' published by Heath et al (Angewandte Chemical International Edition, 41, 351-356 (2002)). In particular, Heath et al noted that Lieber et al used rigid nanowires with controlled length and diameter, and that these were not conditions that could be replicated for nanotubes due to the flexibility and lack of dimensional control of individual nanotubes.

SUMMARY OF THE INVENTION

In general terms, the present invention relates to a method of aligning nanotubes by allowing a suspension of nanotubes to flow in one or more channels to align the nanotubes in a direction parallel to the longitudinal axis of the one or more channels.

In a first specific aspect, the present invention relates to a method of aligning nanotubes comprising: providing a plurality of channels on a substrate, placing a suspension of nanotubes on or adjacent an open surface of the channels, and allowing the suspension of nanotubes to flow into the channels to align the nanotubes substantially parallel to the longitudinal axis of the channels.

In a second specific aspect, the present invention relates to a method of aligning nanotubes comprising: providing a plurality of channels on a substrate, placing a suspension of nanotubes at a distance from the channels, and allowing the suspension to flow into the channels to align the nanotubes substantially parallel to the longitudinal axis of the channels.

As used herein, the terms 'align', 'aligned', 'aligning' and 'alignment' and their grammatical equivalents in relation to nanotubes denote the act of arranging and the resulting arrangement of nanotubes that approximately and collectively have a similar longitudinal direction and that form a conductive path. Nanotubes, unlike nanowires, have inherent flexibility and may not align themselves individually in one direction, as can be seen in FIGS. 6A to 6C. For this reason, the above terms are intended to not only cover alignment of individual nanotubes, but to also generally cover an arrangement of nanotubes that form a collectively aligned pattern and a conductive path, regardless of whether one or more nanotubes are not in a similar longitudinal direction as others in the arrangement.

As used herein, the terms 'comprising' and 'comprises' mean 'consisting at least in part of', that is to say, when interpreting statements in this specification and claims that include those terms, not only the features prefaced by the terms in each statement need to be present but other features can also be present.

BRIEF DESCRIPTION OF THE FIGURES

Example embodiments of the method will now be described with reference to the accompanying figures in which:

FIG. 3 shows a plan view of a nanotube suspension adjacent a channel,
FIG. 4 shows a plan view of the suspension being drawn into the channel,
FIG. 5 shows a side view of the aligned nanotubes,
FIG. 6A-6C show images of example aligned nanotube patterns.

DETAILED DESCRIPTION OF EXAMPLE EMBODIMENTS

Figure 1:
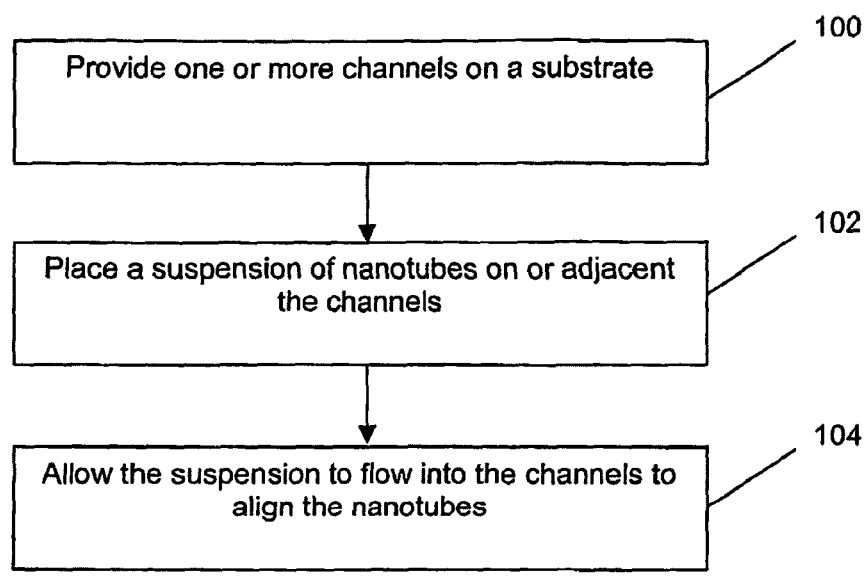
FIG. 1 shows a flow chart of one form of the method.

Referring to FIG. 1, a flow chart of one form of the method is shown. The method includes providing a plurality of channels on a substrate (100), positioning a suspension of nanotubes for flowing into the channels (102), and allowing the suspension to flow into the channels to align the nanotubes (104).

In a first example embodiment, a plurality of channels is provided by assembling a mold and a substrate. The mold includes lengthwise-open relief structures or channels that form lengthwise-closed channels when placed on a substrate. In this embodiment, a suspension of nanotubes is positioned at or adjacent an open surface of the lengthwise-closed channels and is drawn into the lengthwise-closed channels by virtue of capillary attraction. The capillary attraction generates a shear force within the suspension, which aligns the nanotubes substantially parallel to the longitudinal axis of the channels.

Figure 2:
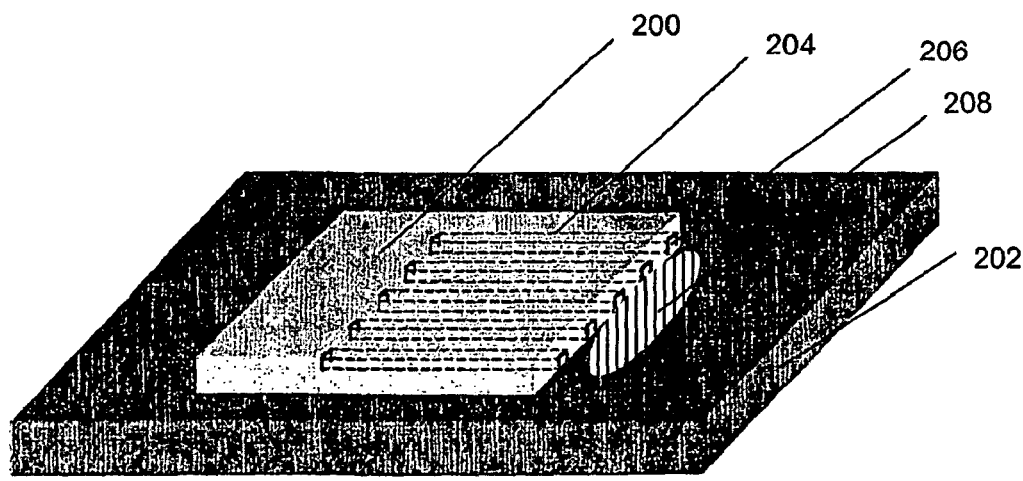
FIG. 2 shows a schematic of a first example embodiment.

A schematic of the first example embodiment is shown in FIG. 2. The figure shows a mold 200, such as a PDMS or rubber mold, that has been placed on a substrate 202. The substrate 202 may be, for example, a silicon, quartz, glass or polyester film substrate. As shown in the figure, the mold 200 is in conformal contact with the surface of the substrate such that the relief structures in the mold, which initially formed lengthwise-open channels, form lengthwise-closed channels 204. Any number of channels 204 may be provided, depending on the width of the mold and the width of the respective channels. In the form shown, each of the channels 204 is provided with an open end 206 as the open surface, although it is possible to provide two or more channels 204 with a single open end. Also, it is possible for both ends of the channels 204 to be open. The placement or arrangement of the channels 204 in the mold 200 may be tailored to suit the eventual use of the nanotubes. As illustrated, each of the channels 204 has a square cross-section (although it is also possible to have a rectangular, semi-circular, triangular or other shape cross-section), and a length of 5 mm or less (although this is not essential as other lengths may be used if desirable or if required). It should be noted, however, that it is not essential for the channels 204 to individually or collectively have the same shape or dimensions as illustrated.

FIG. 2 also shows a suspension of single-wall carbon nanotubes (CNTs) 208 that has been placed adjacent the open end 206 of the channels 204. In this embodiment, the suspension 208 is placed immediately adjacent and in contact with the open end 206 of the channels 204. The suspension 208 typically comprises one or more solvents that are mixed with nanotubes. When the suspension 208 is placed at the open end 206, it will substantially spontaneously fill the channels 204 by virtue of capillary attraction. The spontaneous filling in multiple channels is essentially a simultaneous fluidic alignment process, which is distinguishable from a series of fluidic alignment processes, such as that of Lieber et al, where one channel is provided and filled one at a time. After the channels 204 have been filled and any solvents (e.g. water) in the suspension 208 have been evaporated, the mold 200 is removed, leaving behind a pattern of aligned CNTs on the substrate 202.

The alignment of the CNTs will now be described in further detail with reference to FIGS. 3 to 5. FIG. 3 illustrates the starting point from a plan view, where a suspension of nanotubes 308 is placed adjacent the open end of a channel 304. At the starting point, the suspension's flow velocity is zero and the direction of the CNTs in the suspension is random. Once capillary attraction takes place and the flow starts, as illustrated in the plan view schematic of FIG. 4, the nanotubes will be compelled to align themselves parallel to the flow direction F by a shear force S, which is opposite to the flow direction F. In consequence, the nanotubes will orient themselves to be parallel to the flow direction F to minimise the shear force S acting on them. As illustrated in the side view schematic of FIG. 5, once the suspension fills the channels and the solvent is evaporated, the nanotubes 510 will deposit in an aligned form on the surface of the substrate 502.

To assist with the fluidic alignment process above, both mold and the substrate surface may be made relatively hydrophilic (i.e. having an affinity for water). By providing hydrophilic mold and/or hydrophilic substrate, the suspension may be drawn more quickly and more completely into the channels. This increases the flow in the channels, which in turn increases the shear force acting on the nanotubes to improve its alignment. Referring to FIG. 4, the convex curve on the front of the suspension 308 is typical of channels being hydrophilic. It should be noted, however, that the suspension should not be made to flow too quickly through the channel as this may not provide sufficient time for the nanotubes to reorient themselves before depositing on the substrate.

A non-limiting experiment of the first example embodiment will now be described. Skilled persons will appreciate that the steps carried out, the parameters specified and the substances used for the experiment are examples only. Where necessary or desired, they can be varied. In the experiment, the mold used was a PDMS (polydimethylsiloxane) mold that was replicated from a submicron quartz master at 100° C. for 16 hours. After peeling off the PDMS mold from the master, post curing was carried out at 100° C. for 24 hours. Before use, the PDMS mold was cleaned in successive ultrasonic baths containing acetone, ethanol and distilled (DI) water for 15 minutes, 15 minutes and 30 minutes respectively and then dried at 100° C. for 24 hours. The resulting PDMS mold had submicron channels having a width of 850±50 nm, a depth of 400±20 nm, and a length of 1-5 mm.

The PDMS mold was exposed to argon plasma in a March PX-500 Cleaning System for 4 minutes to obtain a relatively hydrophilic surface. In this hydrophilic treatment, the power supply was set at 100 W and the argon flow rate was 350 sccm. After air-aging for 30 minutes, the mold was used relatively quickly, and preferably immediately. The hydrophilic treatment is preferably carried out since an as-fabricated PDMS mold may have inherent hydrophobicity (i.e. repels water), which may prevent the suspension of nanotubes from flowing into and filling the channels. The treatment allows the PDMS surface to become sufficiently hydrophilic (deionised water contact angle of 50° or less (e.g. 46°) or, preferably, 30° or less) to be wetted by water so that the suspension may spontaneously fill the channels. As will be known to skilled persons, a substance's water contact angle is the angle at which the water's interface meets the surface of the substance and is an indication of the surface's hydrophobicity or hydrophilicity. A high water contact angle (70°-90°) denotes a highly hydrophobic surface, while a low water contact angle (0°-30°) denotes a highly hydrophilic surface. The treated mold is preferably used relatively quickly after treatment since hydrophobic recovery may take place in several hours.

The substrates employed in the experiment were silicon wafer, glass wafer and polyester film. The silicon wafer was cut into small pieces, cleaned in piranha solution ($H_2SO_4$: $H_2O_2$=15:1 in volume) at 120° C. for 30 minutes, rinsed with DI water for an hour, and dried at 120° C. for 1 hour. The wafers were then further cleaned in $O_2$-plasma (300 W and 15 sccm) for 30 minutes. The plasma treatment was carried out in a Technics 800-II Series Reactive Ion Etching System equipped with a 700 W solid state radio frequency generator operating at 13.56 MHz. For the glass wafer, the small pieces were thoroughly washed in successive ultrasonic baths containing acetone, ethanol and DI water for 15 minutes, 15 minutes and 30 minutes respectively and then dried at 60° C. for 24 hours. Before use, both silicon and glass wafers were immersed in a 1 wt % ethanol solution of amine-terminated silane (e.g, 3-aminopropyltriethoxysilane) at room temperature for 2 hours, thoroughly rinsed with ethanol, followed by thermal treating at 100° C. for 1 hour, and used immediately. To hydrophilize the polyester films, the same argon plasma treatment conditions applied to PDMS molds as described above were adopted, i.e. argon flow rate 350 sccm, discharge power 100 W, and exposure time 4 minutes in a March PX-500 Cleaning System. After air aging for 30 minutes, the hydrophilized polyester film was used immediately.

The suspension of nanotubes was prepared using long (l-SWNT) and short single-wall CNTs (s-SWNT). The preparation was done according to the method previously reported by Smalley et al (Science 1998, 280, 1253). The starting material of CVD-produced SWNTs with a purity of 60% was obtained from Chengdu Organic Chemicals Co. Ltd. China. After purification, the nanotubes were chopped in an acid mixture (98% $H_2SO_4$ 70% $HNO_3$=3:1) at 35-40° C. for about 10 hours with sonication (ultrasonic water bath). Both purification and chopping of SWNTs make use of the methods of Smalley's group (Science 1998, 280, 1253). The collected solids were suspended in deionized (DI) water, adjusted to pH=4-5 with 10 mM HCl and NaOH solutions, and subsequently ultrasonicated in a water bath for 1 hour. After standing overnight, around three quarters of the upper suspension was collected and diluted with DI water to 20, 5.0, and 2.5 $mg.L^{-1}$ s-SWNT suspensions. Prior to each use, the suspensions were re-ultrasonicated in a water bath for 10 minutes and used within 1 hour. To prepare the l-SWNT suspension, purified SWNTs were dispersed into 1 wt % SDS (sodium dodecyl sulphate) solution and ultra-sonicated for 1 hour in water bath. For the l-SWNT suspension, its concentration was about 5 $mg.L^{-1}$.

Figure 6B:
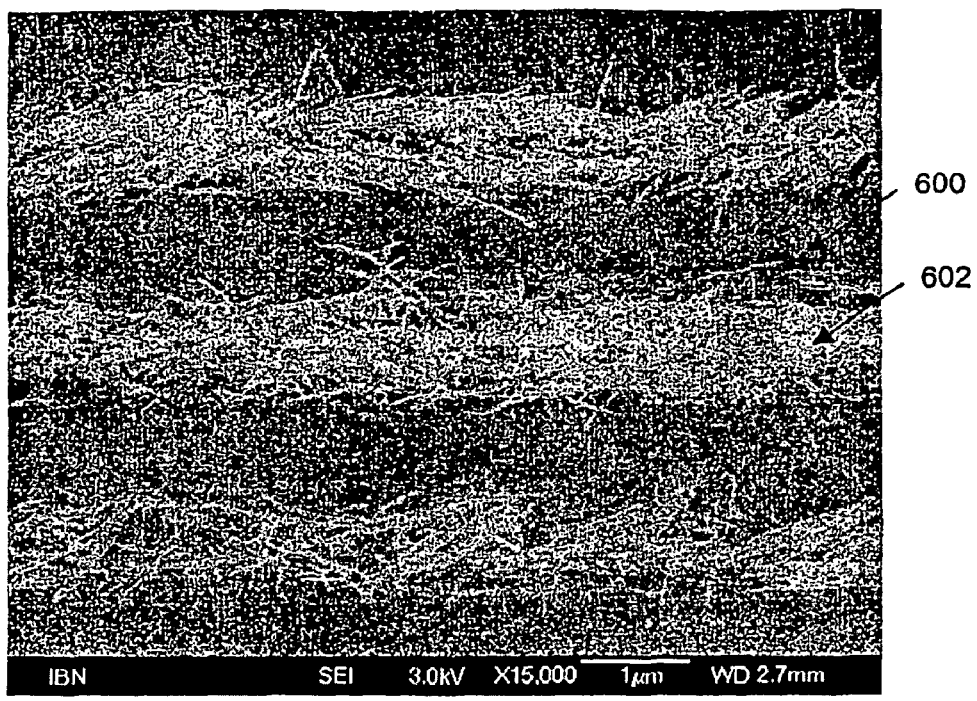
Figure 6C:
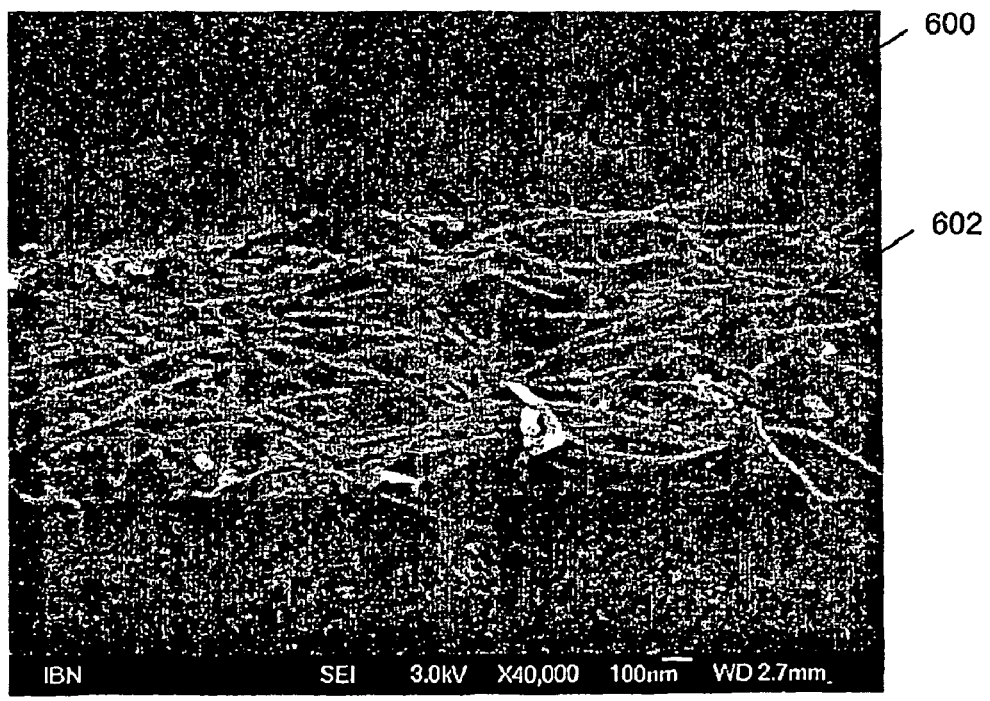

The s-SWNT suspension was positioned at or adjacent an open surface of the channels. Once the suspension came into contact with the channels, the suspension was spontaneously drawn into the channels by capillary attraction. About 30 minutes or less after the channels were filed, the mold was carefully removed. The resulting aligned SWNT on a silicon substrate is shown in the field emission scanning electron microscope (FE-SEM) images of FIG. 6. FIGS. 6A, 6B and 6C show the aligned nanotube patterns respectively prepared from 20, 5.0 and 2.5 $mg.L^{-1}$ s-SWNT suspensions. The darker areas (shown generally as 600) in the images correspond to naked substrate surfaces and the lighter areas (shown generally as 602) correspond to the nanotube patterns. It is worth to note that the dimensions of the nanotube patterns were limited by the dimensions of PDMS mold used and not the method itself.

The experiment showed that when the concentrated s-SWNT suspension (20 $mg.L^{-1}$) or higher dosages (more than 1 µl) of diluted solution is used, the resulting nanotube patterns showed an acceptable level of alignment. However, improved alignment was observed for normal dosages (0.2-1.0 µL) of the 0.5 mg/L and 2.5 mg/L diluted suspensions. It is therefore preferable, although not essential, for the suspension to have a concentration of 100 mg/L or less.

The concentration also affected the coverage of the substrate (i.e. how many nanotubes were deposited). As the concentration increased, so did the coverage. This indicated that the substrate coverage is controllable by adjusting the suspension concentration.

The experiment also showed that the substrate surface should be treated to ensure successful alignment and patterning of nanotubes. For instance, the substrate may be functionalised with 3-aminopropyltriethoxysilane (APTES) or other aminesilane (e.g, amino propyl trimethoxy silane) solution so that the substrate's surface has a water contact angle of 25° or less and is thus hydrophilic. In one form, the substrate is treated until it has a water contact angle of 15° or less. The experiment also showed that the CNTs may deposit more quickly, robustly and in greater amounts on functionalised silicon, quartz, glass or polyester film substrates as compared to non-functionalised equivalent substrates.

Although the experiment was carried out using submicron channels with a width of around 850 nm, it is possible to use instead submicron channels having width of 650 nm or less, or 1 µm or less. The length of the channels may be 5 mm or less. It is also preferable, although not essential, for the channel width and height (i.e. depth) to bear a relationship with the average length of the nanotubes. For instance, the ratio of the average nanotube length to the channel width may be between 1:1 and 1:2. The ratio of the average nanotube length to the channel height may be between 1:1 and 1:1.5. Alternatively, the nanotubes may be provided with a length that is equal to or less than the width and the height of the channels. This may prevent clogging or jamming of the nanotubes as the nanotube suspension flows into the channels.

In a second example embodiment, the method may be carried out without the use of the mold of the first example embodiment. Here, providing one or more channels on a substrate is carried out by locating or patterning lengthwise-open channels on the substrate.

Figure 7:
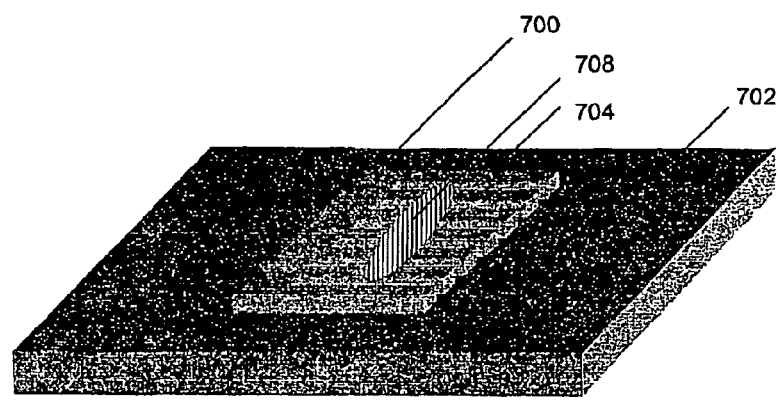
FIG. 7 shows a schematic of a second example embodiment.

A schematic of the second example embodiment is shown in FIG. 7. The figure shows a patterning material 700 that has been patterned onto the substrate 702. In one form, the material 700 is a photo-resist material (e.g., AZ5214 from Clariant and S1813 from Shipley) that is provided on the substrate 702 and that forms the channels 704 when the substrate 702 is photolithographed. In another form, the patterning material 700 may be polymethylmethacrylate (PMMA) and organic-inorganic hybrid material such as ORMOCER®s that have been pre-patterned with channels 704 through a nanoimprinting process. Besides photolithography, the channels may be provided by molding, surface grafting or surface polymerization, with the channels being defined by a polymeric or organic material.

Also, in the second example embodiment, the suspension 708 of nanotubes need not be placed at the open end 706 of the channels 704. However, the suspension 708 may be placed at the open end 706 if required or desired. The second example embodiment simply gives the option of placing the suspension 708 on the channels 704, as shown in FIG. 7, since the channels 704 have open surfaces in the form of lengthwise-open sides. By placing the suspension 708 on the lengthwise-open sides of the channels 704, the suspension 708 may flow into and fill the channels 704 quicker than if the suspension 708 was placed at one open end.

Figure 8A:
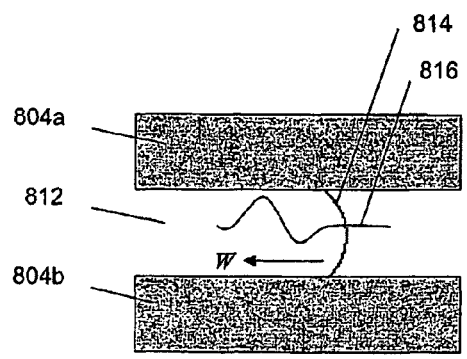
FIGS. 8A and 8B show surface tension of the suspension aligning a nanotube.
Figure 8B:
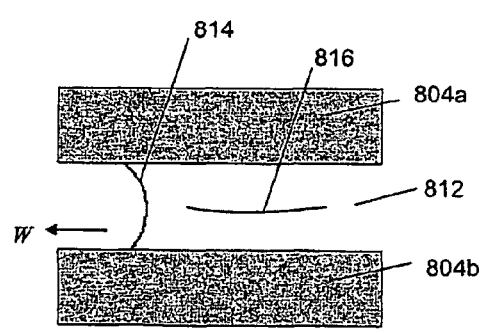

To assist with alignment, the channels are preferably provided with substantially hydrophobic side walls. This may be done by using a naturally hydrophobic material to pattern the channels or by treating the patterning material (or at least the side walls of the chapel) to make it hydrophobic. The benefit of providing hydrophobic sidewalls is illustrated in FIGS. 8A and 8B. In both figures, the hydrophobic sidewalls are shown from a plan view and are labelled 804a and 804b. The base 812 of the channel, which is part of the surface of the substrate, is hydrophilic relative to the sidewalls 804a and 804b. In one example form, the base may be treated with an amine-terminated solution to make it hydrophilic. Due to the different wetting (hydrophilic/hydrophobic) properties for the channels, the nanotubes in a suspension that flows in the channels will have a greater affinity to the hydrophilic base, rather than the hydrophobic sidewalls. As a result, the liquid-solid-air contact receding line in the channel would form a meniscus shape with a convex line face to dry surface. FIG. 8A shows the meniscus-shaped fluid-air interface surface 814 of the suspension withdrawing in the direction W as the solvent within the suspension evaporates, leaving behind the nanotube 816. As can be seen in FIG. 8B, as the suspension withdraws, surface tension of the fluid-air interface surface forces the nanotube 816 to align itself substantially parallel to the longitudinal axis of the channel, as it is deposited on the hydrophilic surface of the base 812.

A non-limiting experiment of the second example embodiment will now be described. As before, skilled persons will appreciate that the steps carried out, the parameters specified and the substances used for the experiment are examples only. In the experiment, about 50 mg of single-wall carbon nanotubes (SWNTs) from Chengdu Organic Chemicals Co. Ltd. China was refluxed in 100 mL of 2.0M $HNO_3$ for 4 hours. The solid was collected and rinsed with deionised (DI) water on a 0.2 μm-pore PTFE (polytetrafluoroethylene) membrane filter. The purified SWNTs, which were 2 μm long were dispersed in an aqueous sodium dodecyl sulfonate solution (SDS 2.0 wt %). The SWNT concentration was about $1.0 \times 10^{-3}$ mg/mL. Before each use, the suspension was centrifuged at 10,000 rpm for 1 hour and the supernatant SWNT suspension was collected for the experiment.

To pattern the channels on the substrate, photo-resist resin was used and photolithography was carried out, resulting in microchannels measuring 900 μm long, 1.0±0.5 μm wide and 1.0±0.5 μm deep separated by 1.5 μm-wide walls on a silicon wafer with a 100 nm silicon dioxide layer. The wafer was then immersed into an amine-containing silane (3-aminopropyl-triethoxysilane (APTES), 0.5 wt %) solution at room temperature for 4 hours. In this way, the silicon wafer was functionalised so that its surface had a water contact angle of 25° or less, or 15° or less. Following that, the wafer was rinsed using DI water, dried using $N_2$ flow, and thermally treated at 100° C. for 2 hours. This treatment increases the affinity of the nanotubes to the substrate surface, promoting their adhesion after patterning.

The wafer patterned with the photoresist microchannels was then placed on a flat hot plate, and a drop (0.2-1.0 μL) of freshly prepared SWNT suspension was placed on the microchannels. Once the microchannels were filled via capillary action, the microchannels were allowed to dry in the air at 40° C. Once dried, the photoresist was removed using acetone, leaving aligned patterns of nanotubes on the silicon wafer.

In a third example embodiment, the method may be carried out by including a pre-alignment process. Here, instead of placing a suspension of nanotubes adjacent the channels, the method provides for the placing of the suspension at a distance from the channels and allowing the suspension to flow toward the channels. This embodiment may be incorporated into the first and second example embodiments where pre-alignment is desired or required.

The process of pre-aligning the nanotubes is essentially aimed at reducing a 'log jam' effect at the open surface of the channels, where the suspension of nanotubes flows or is drawn into the channels by capillary attraction. Without pre-alignment, the randomly oriented nanotubes may partially block the open end of the channels, preventing the suspension from being completely drawn into the channels. By pre-aligning the nanotubes, the blockage may be reduced since the nanotubes would be aligned substantially parallel to the longitudinal axis of the channels before they enter the channels. Pre-aligning may also improve the resulting alignment where the nanotubes are not placed adjacent an open surface of the channels, but are instead placed on the channels, as in the second example embodiment.

Figure 9:
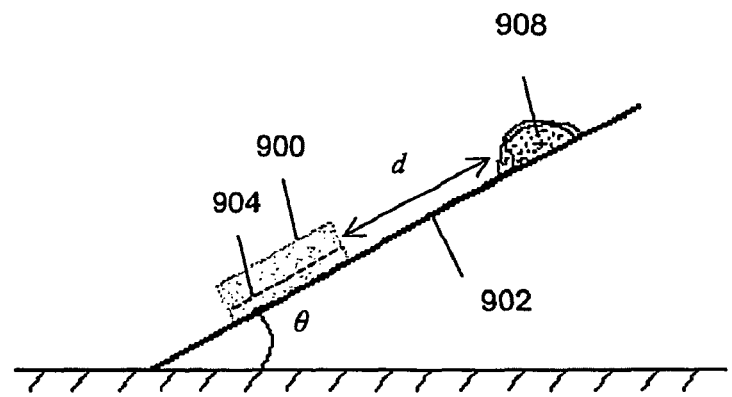
FIG. 9 shows one form of a third example embodiment.

There are a number of ways in which the nanotubes may be pre-aligned. One way is to tilt the substrate so as to impart a flow to the suspension before it reaches the channels. As can be seen in FIG. 9, the suspension 908 is placed at a distance d from the open surface of the channels 904. The channels may be defined by a material 900, which may be the mold of the first example embodiment or the patterning material of the second example embodiment. By tilting the substrate 902 at an angle of θ, the suspension 908 would be imparted with a flow in the direction of the channels 904. The flow imparts a shear force on the nanotubes, which helps at least some of the nanotubes align to be parallel to the longitudinal axis of the channels. Where tilting is used to pre-align the nanotubes, the tilt angle θ should be greater than 0° (although this is not essential where other means are used to pre-align the nanotubes, as will be described below). The angle may be 10° or less, 30° or less, or 60° or less. It should be noted that a high tilt angle (more than 60°) may impart a flow that is so fast that the nanotubes may not have enough time before reaching the channels to be aligned properly via shear forces. However, this may be addressed by adjusting the concentration of the suspension or by providing one or more further pre-alignment methods as described below. A high tilt angle (more than 60°) may therefore be used where desired. It should also be noted that the distance d may be changed to suit a particular concentration of suspension or a particular tilt angle. The distance d may be, for example, 5 mm or more, or 1 cm or more.

Another way to pre-align the nanotubes is to eject the nanotubes from a needle or similar device (e.g. a syringe or pump) onto the substrate. This would provide some alignment to the nanotubes before the suspension reaches the channels.

Figure 10:
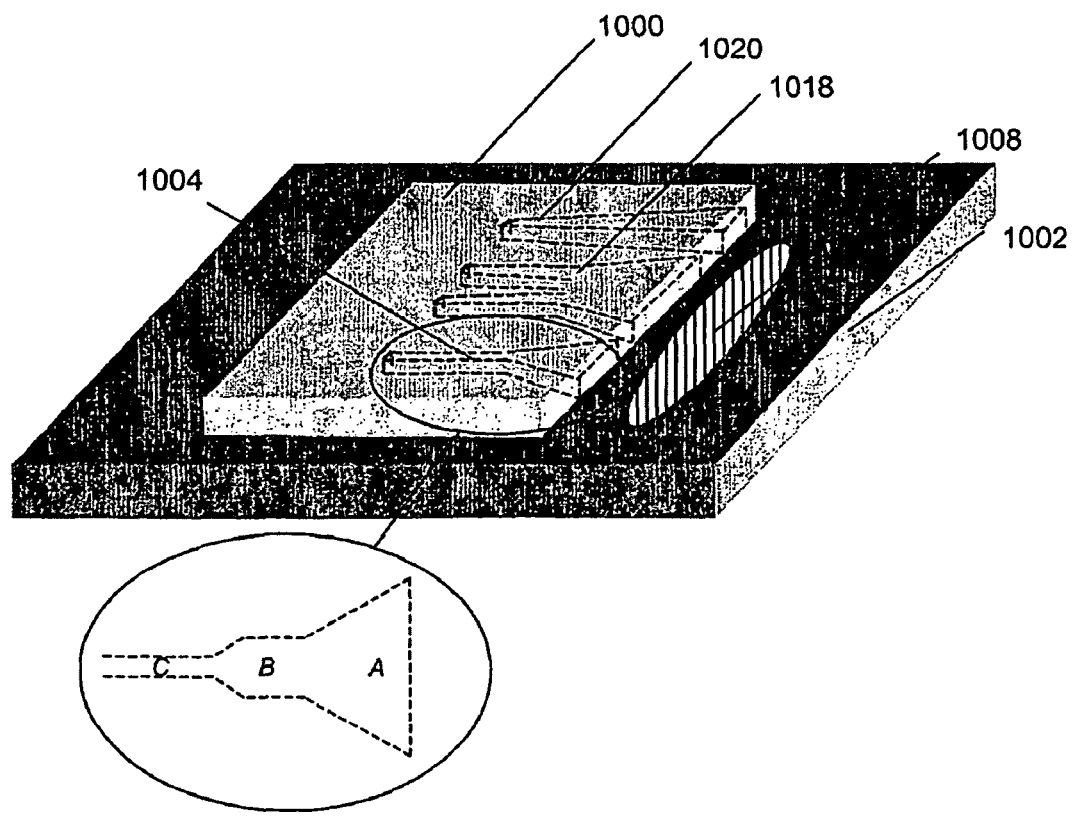
FIG. 10 shows another form of the third example embodiment.

A further way to pre-align the nanotubes is to provide a horn-shaped or funnel-shaped open surface (e.g. open end) for the channels. FIG. 10 shows two example forms of a horn-shaped open end. In the form illustrated, a material 1000, which provides channels 1004, 1018 and 1020, is placed on a substrate 1002. The material 1000 may be the mold of the first example embodiment or the patterning material of the second example embodiment. For clarity purposes, four channels have been shown in the figure. Where necessary or desired, more channels or fewer channels may be employed. The channel 1004 is shown with a tapering open end that leads into one channel, while the channel 1018 is shown with a tapering open end that leads into two or more channels. In these channels, the tapering ends partway between the open end and the other end of the channels. Channel 1020 shows a different form of tapering that begins at the open end and terminates at the other end of the channel. The dimensions of the tapering open end may be tailored to suit the concentration of suspension being used or the size of the channels themselves. For instance, the tapering may be from 10 μm (at the open end) to 200 nm over a tapering distance of 2 mm. In another form, the tapering may be from 10 μm (at the open end) to 1 μm over a tapering distance of 3 mm. Also, each channel may have one or more intermediate widths connecting the tapering end to the other end of the channel. For instance, the open end (labelled A) of channel 1004 may have a width of 1 mm, which decreases to a width of 1 μm partway through (labelled B) the channel. Another taper is formed in the channel, which leads into a narrower portion (labelled C), which may have a width of 200 nm. Skilled persons will also appreciate that it is not essential for the tapering to be linear. Non-linear tapering, such as a curved taper, multi-stage taper with varying dimensions or similar, may also be used.

Another way to pre-align the nanotubes is to blow the suspension of nanotubes toward the channels using a flow of gas in a direction parallel to the longitudinal axis of the channels. Here, the suspension of nanotubes is preferably placed at a distance from the channels, and is subjected to a flow of gas. Non-limiting examples of gas that can be used are air and $N_2$. The flow of gas serves to push the suspension toward the channels, and, in doing so, provide some alignment to the nanotubes prior to being drawn into the channels. In particular, the flow of gas over the suspension may set up a circulation pattern in the suspension as it is driven across the substrate toward the channels. The nanotubes float in this circulation pattern and align themselves parallel to the fluid flow to reduce resistance. In this way, the nanotubes may be somewhat aligned parallel to the channel orientation before they reach the channels in a mold. Where no mold is used or where the channels are open lengthwise (e.g. the second example embodiment), the suspension may be blown into and along the channels.

It is also possible to subject the nanotubes to a second flow of gas after the suspension has been drawn into the channels. This second flow of gas is also preferably in a direction parallel to the longitudinal axis of the channels. The second flow of gas may further stretch the nanotubes and clear any debris from the aligned nanotubes. Once the suspension has been drawn into the channels and allowed to dry, the substrate may not be completely dry. Instead, the substrate may be covered with a thin film of water. The nanotubes may still move along the surface of the substrate under a flow of gas, although it may not flow as freely as in a droplet. The second flow of gas, when used, may exert a shear force on the individual nanotubes and lead to their alignment and straightening along the flow direction. When a misaligned nanotube is partly anchored to other aligned nanotubes by van der Waals interaction, the shear force may bend or rotate the nanotube into better alignment.

The use of the first and second gas flows may also increase the length and decrease the width of each aligned nanotube pattern as compared to the patterns obtained from alignment that is carried out without using a gas flow. This is especially so in the use of the second flow of gas, where nanotubes may be carried away from the typical width of the aligned nanotubes pattern (e.g. 1 μm) either by direct gas force on the nanotubes or by advection in fluid motion produced by the gas flow. As the nanotubes are drawn away from the patterns, they contact other nanotubes and adhere to them, forming a connected chain. As this process continues, a continuous nanotube strand, much longer than the individual nanotube, may be formed.

The above pre-alignment techniques are examples only and are not essential to the method. Also, the techniques need not be carried out individually to the exclusion of other techniques. Two or more techniques may be combined for improved alignment. For example, a tapering open end may be provided and a flow of gas may be used to push the suspension toward the tapering end. Additionally, the substrate may be tilted. Pre-alignment techniques not mentioned above, such as those relying on a magnetic field, may also be used. Other combinations and techniques as will be apparent to skilled persons are intended to be incorporated in this description.

In a fourth example embodiment, once the nanotubes have been aligned using any one of the above example embodiments, the method may include placing the nanotubes on an electrode that forms or that will form part of an electronic device. In one example, the aligned nanotubes may be transferred to patterned gold electrodes, which may be arranged to form a field effect transistor (FET). The transfer is preferably done using a stamp, such as a PDMS stamp, that has been pre-treated to provide a surface that will securely hold the aligned nanotubes. For example, the stamp may be treated in argon plasma. It is, of course, also possible to use the substrate itself as the stamp.

The electrodes are also preferably treated to securely receive the aligned nanotubes. For example, the surface of the electrodes may be aminoated with a self-assembled monolayer (SAM) of an aminothiol such as 11-Amino-1-mercaptoundecane, aminoethane thiol, aminopropane thiol, and so on. To create the SAM, the electrodes are immersed into a 0.5 mM aminothiol toluene solution for 12 hours. Subsequently the electrodes are thoroughly rinsed with toluene and cleaned in an ultrasonic bath containing ethanol for 15 s to remove possible surface contaminants. The electrodes are then immersed into a PH=2.0 HCl solution to convert the $NH_2$ group to $NH_3^+$. Once treated, the stamp with the aligned nanotubes is made to contact the electrodes for several seconds. Where a SAM is formed on the electrodes, the nanotubes may be transferred quickly at ambient temperature. To further aid this transfer, the nanotubes may be treated with nitric acid to produce carboxyl groups on their surfaces and ends before the nanotubes undergo the alignment process. Once transferred, the cationic —$NH_3^+$ group (on the electrodes) and anionic —$COO^-$ group (on the nanotubes) complex electrostatically to transfer the aligned nanotubes on the stamp onto the electrode surface. The stamp is then removed, transferring the aligned nanotubes to the electrodes' surface.

To reduce the contact resistance between the nanotubes and the electrodes, thermal annealing may be carried out. For example, the annealing may be carried out at 300° C. for 30 minutes in an air environment. This may remove adsorbed molecules affecting the nanotube-electrode interface.

It will be noted that transferring the aligned nanotubes to an electrode is not essential. Where necessary or desired, the nanotubes may be simultaneously aligned and placed on the surface of the electrode. For instance, electrodes may be placed on the substrate and channels may be positioned over the electrodes such that the nanotubes are immediately placed on the electrode once it is aligned in the channels. Alternatively, electrode pads may be placed on the aligned nanotubes, and electrodes may be coupled to the pads.

A non-limiting example experiment of the above transfer method will now be described. As before, skilled persons will appreciate that the steps carried out, the parameters specified and the substances used for the experiment are examples only. In the experiment, about 80 mg of single-wall carbon nanotubes (SWNTs) was refluxed in 50 mL of 2.6 M $HNO_3$ for 48 hours. The solid was collected on a 0.2 μm-pore PTFE membrane filter and rinsed with 10 mL deionised (DI) water. The purified SWNTs were dispersed again in DI water, adjusted to pH 4~5 with 10 mM HCl and NaOH solutions, and subsequently ultrasonicated in a water bath for 1 hour. Before each use, the suspension was centrifuged at the speed of 10,000 rpm for 1 hour and the supernatant solution was collected for the experiment.

The channels in the experiment were patterned on a PDMS mold that was replicated from a submicron quartz master. The channels measured 1-5 mm long, 850±50 nm wide and 400±20 nm deep separated by 850 nm-wide walls. Sylgard-184 (Dow Corning) with a weight ratio of 5:1 of the Base to the Curing Agent was used as the PDMS material. The curing condition was 100° C. for 16 hours. After peeling from the master, the PDMS mold was post-cured at 100° C. for 1 hour. Subsequently, the PDMS molds were cleaned in successive ultrasonic baths containing acetone, ethanol and DI water for 15 minutes, 15 minutes, and 30 minutes respectively and then dried at 100° C. for 1 hour.

The electrode used in the experiment comprised a silicon substrate coated with a $SiO_2$ layer with a pattern of parallel gold stripes of 40 nm thickness deposited on the $SiO_2$ layer. An $HS(CH_2)_{11}NH_2$ self assembled monolayer (SAM) was prepared by immersing the electrode (previously treated in piranha solution at 90° C. for 10 minutes) into a HS $(CH_2)_{11}NH_2$ ethanol solution (0.5 mM) for 12 hours. After monolayer assembly, the electrode was rinsed with ethanol and sonicated in ethanol for 15 seconds to remove possible surface contaminants.

The surface of the PDMS mold and stamp were treated in argon plasma with 350 sccm flow rate for 2 minutes in a Technics 800-II Series Reactive Ion Etching System operated at 13.56 MHz. The glow discharge was ignited at 100 W. After exposure to ambient air for about 30 minutes, the surfaces became temporarily hydrophilic. Then the PDMS mold was placed channel side down in conformal contact with the surface of the PDMS stamp. When the nanotubes solution was dropped at an open end of the channels, the liquid spontaneously filled the channel by capillary attraction, aligning the suspended CNTs in the process. After channel filling, water in the channels was left to evaporate, PDMS mold was removed, and the nanotube-patterned stamp was dipped in DI water for 2 hours to remove possible contaminants and loose nanotubes on the surface.

The gold electrodes previously treated with thiol solution were immersed into deionised water (pH=4.5) and then spun at 2000 rpm for 10 seconds to leave a thin film of water. The stamp with aligned nanotube patterns was then contacted with the gold electrodes for 4 seconds, and then removed, transferring the aligned nanotubes to the gold surface.

Where used, the transfer method above may achieve quick (in the order of seconds) large-area nanotube pattern transfer to many electrodes in ambient temperature. The transfer technique may also be applied to non-flat or undulating electrode patterns and surfaces, and may be used to conveniently control the lateral orientation of the nanotube patterns.

The foregoing describes exemplary embodiments, which, as will be understood by those skilled in the art, may be subject to many variations or modifications in design, construction or operation without departing from the scope of the present invention as claimed. For example, although the example embodiments have been described with reference to single-wall carbon nanotubes, the method may also be used with multi-wall carbon nanotubes or inorganic nanotubes. Furthermore, although the experiments above provide aligned patterns of CNTs having a width of about 1-2 μm, this may be changed by changing the width of the channels in the mold or substrate. The length of the channels may also be varied. A long channel may provide long nanotube patterns that may connect many electrodes. The extent of alignment may also be modified by, for example, adjusting the suspension concentration or dosage (i.e. how much is placed on the substrate).

What is claimed:

1. A method of aligning nanotubes comprising:
   providing a plurality of channels on a substrate;
   placing a suspension of nanotubes on or adjacent an open surface of the channels, and
   allowing the suspension to flow into the channels to align the nanotubes substantially parallel to the longitudinal axis of the channels,
   wherein the channels are lengthwise-closed channels and the open surface is an open end; and
   pre-aligning the nanotubes in the suspension before allowing the suspension to flow into the channels, thereby reducing blockage of the open end of the channels by randomly oriented nanotubes in the suspension.

2. The method of aligning nanotubes as claimed in claim 1, wherein providing a plurality of channels comprises placing a mold having a plurality of lengthwise-open channels onto the substrate to form a plurality of lengthwise-closed channels.

3. The method of aligning nanotubes as claimed in claim 2, wherein the method further comprises treating the mold so that the lengthwise-open channels are substantially hydrophilic before placing the mold on the substrate; treating the mold comprises treating with plasma; and after being treated, the channels in the mold have a water contact angle of 50° or less.

4. The method of aligning nanotubes as claimed in claim 1, wherein the method further comprises treating the substrate such that the substrate surface forming at least part of the plurality of channels has a water contact angle of 25° or less.

5. The method of aligning nanotubes as claimed in claim 1, wherein placing the suspension of nanotubes comprises placing the suspension to be in contact with the open surface so that the suspension will flow into the channels.

6. The method of aligning nanotubes as claimed in claim 1, wherein the suspension of nanotubes is drawn into the channels by capillary attraction.

7. The method of aligning nanotubes as claimed in claim 1, wherein allowing the suspension to flow into the channels comprises allowing the suspension to be drawn into each of the plurality of channels substantially simultaneously.

8. The method of aligning nanotubes as claimed in claim 1, wherein pre-aligning the nanotubes is achieved by at least one selected from the group consisting of:
   tapering the open end into the at least one channel, providing the open end with a horn or funnel shape, ejecting the suspension from one of a needle, syringe or pump, placing the suspension at a distance from the channels and using a flow of gas to blow the suspension towards the channels, and placing the suspension at a distance from the channels and tilting the substrate to impart a flow to the suspension before allowing the suspension to flow into the channels.

9. The method of aligning nanotubes as claimed in claim 8, wherein tilting the substrate comprises tilting at an angle θ, where $0° < \theta \leq 60°$.

10. The method of aligning nanotubes as claimed in claim 2 further comprising removing the mold and using a flow of gas to blow the aligned nanotubes in a direction parallel to the longitudinal axis of the aligned nanotubes.

11. A method of aligning nanotubes comprising:
    providing a plurality of channels on a substrate;
    placing a suspension of nanotubes at a distance from the channels;
    allowing the suspension to flow into the channels to align the nanotubes substantially parallel to the longitudinal axis of the channels, wherein the channels are lengthwise-closed channels having at least one open end; and pre-aligning the nanotubes in the suspension before allowing the suspension to flow into the channels, thereby reducing blockage of the at least one open end of the channels by randomly oriented nanotubes in the suspension.

12. The method of aligning nanotubes as claimed in claim 11, wherein pre-aligning comprises at least one of: using a flow of gas to blow the suspension toward the channels, and tilting the substrate to impart a flow to the suspension wherein the tilting is at an angle $\theta$, where $0°<\theta\leq 60°$.

13. The method of aligning nanotubes as claimed in claim 11 further comprising allowing any solvent in the suspension to evaporate and using a flow of gas to blow the aligned nanotubes in the direction of the channels once the solvent has substantially evaporated; wherein the open end tapers into one or more of the channels, wherein the open end having a horn or funnel shape; and wherein placing a suspension of nanotubes comprises placing the suspension at a distance of 5 mm of more from the open end.

14. The method of aligning nanotubes as claimed in claim 11 further comprising placing the aligned nanotubes or aligning the nanotubes on an electrode having a surface that has been modified to include a self-assembled monolayer; providing the channels such that the nanotubes are placed on the electrode as they are aligned substantially parallel to the longitudinal axis of the channels; and placing the aligned nanotubes comprises transferring the aligned nanotubes from the substrate to an electrode surface.

15. The method of aligning nanotubes as claimed in claim 14, wherein providing one or more channels comprises providing a mold having one or more lengthwise-open channels and placing the mold on the substrate or electrode such that the lengthwise-open channels form lengthwise-closed channels having at least one open end; and treating the mold to improve its hydrophilicity before placing the mold on the substrate.

16. The method of aligning nanotubes as claimed in claim 14, wherein placing the aligned nanotubes comprises at least one selected from the group consisting of: removing the mold and using the substrate as a stamp to place the aligned nanotubes on the electrode surface, and transferring the aligned nanotubes from the substrate to a stamp and subsequently transferring the aligned nanotubes from the stamp to the electrode surface.

17. The method of aligning nanotubes as claimed in claim 16, wherein the substrate and stamp are formed using polydimethylsiloxane (PDMS).

18. The method of aligning nanotubes as claimed in claim 14 further comprising placing a thin layer of water on the electrode surface before placing the aligned nanotubes on the electrode; and placing a thin layer of water comprises immersing the electrode into water and spin-coating the electrode.

19. The method of aligning nanotubes as claimed in claim 18, wherein the self-assembled monolayer is provided by immersing the electrode in a solution of an aminothiol.

20. The method of aligning nanotubes as claimed in claim 11, wherein the nanotubes are single-wall carbon nanotubes, and are acid treated.

21. The method of aligning nanotubes as claimed in claim 11, wherein the channels have an average width of 1 μm or less.

22. The method of aligning nanotubes as claimed in claim 11, wherein the suspension of nanotubes has a nanotube concentration of 100 mg/L or less.

23. The method of aligning nanotubes as claimed in claim 22, wherein the nanotube concentration is between 2.5 mg/L and 20 mg/L.

24. The method of aligning nanotubes as claimed in claim 11, wherein the nanotubes in the suspension of nanotubes have an average length in the range 1 to 2 μm.

25. The method of aligning nanotubes as claimed in claim 11, wherein the ratio between the average length of nanotubes and the width of the channels is in the range of 1:1 to 1:2.

26. The method of aligning nanotubes as claimed in claim 11, wherein the ratio between the average length of nanotubes and the height of the channels is in the range of 1:1 to 1:1.5.

* * * * *